(12) United States Patent
Tapie et al.

(10) Patent No.: US 8,368,812 B2
(45) Date of Patent: Feb. 5, 2013

(54) PLL LOOP ABLE TO RECOVER A SYNCHRONISATION CLOCK RHYTHM COMPRISING A TEMPORAL DISCONTINUITY

(75) Inventors: Thierry Tapie, Rennes (FR); Serge Defrance, Rennes (FR); Catherine Serre, Saint Gregoire (FR)

(73) Assignee: Thomson Licensing, Issy les Moulineaux (FR)

( * ) Notice: Subject to any disclaimer, the term of this patent is extended or adjusted under 35 U.S.C. 154(b) by 337 days.

(21) Appl. No.: 12/733,495

(22) PCT Filed: Sep. 5, 2008

(86) PCT No.: PCT/EP2008/061756
§ 371 (c)(1),
(2), (4) Date: Mar. 4, 2010

(87) PCT Pub. No.: WO2009/030739
PCT Pub. Date: Mar. 12, 2009

(65) Prior Publication Data
US 2010/0214477 A1 Aug. 26, 2010

(30) Foreign Application Priority Data
Sep. 7, 2007 (FR) .................................... 07 57419

(51) Int. Cl.
*H04N 5/04* (2006.01)
(52) U.S. Cl. ..................... 348/537; 348/536; 375/376
(58) Field of Classification Search .......... 348/536–537; 375/376, 359
See application file for complete search history.

(56) References Cited

U.S. PATENT DOCUMENTS

| 4,316,152 A | 2/1982 | Meyer |
| 5,881,114 A * | 3/1999 | Moon ............................ 375/376 |
| 5,995,156 A * | 11/1999 | Han et al. ...................... 348/500 |
| 6,313,879 B1 * | 11/2001 | Kubo et al. ................... 348/512 |
| 6,636,092 B1 | 10/2003 | Stine |
| 2004/0223578 A1 | 11/2004 | Lagarde |
| 2009/0175271 A1 | 7/2009 | Tapie et al. |

FOREIGN PATENT DOCUMENTS

| EP | 1484674 | 12/2004 |
| FR | 2854751 | 11/2004 |
| WO | WO 2007/104891 | 9/2007 |

OTHER PUBLICATIONS

Search Report Dated Dec. 16, 2008.

* cited by examiner

*Primary Examiner* — Michael Lee
(74) *Attorney, Agent, or Firm* — Tutunjian & Bitetto, P.C.

(57) ABSTRACT

The present invention relates to the domain of video equipment. It relates to a phase-locked loop able to recover the timing of a synchronization signal comprising a temporal discontinuity of a maximum amplitude equal to PCR_Modulus, the loop comprising:
 a sample comparator comparing the samples and the local samples of a synthesized signal,
 means for producing the synthesized signal from a corrected signal,
 a corrector receiving a comparison result delivered by the comparison means and delivering the corrected signal,
 According to the invention, the comparison means comprises the means to determine a difference in value between the local samples and the samples of the synchronization signal and in that the comparison result has a value that depends on the value $\epsilon$ and on the difference between the value $\epsilon$ and the value PCR_Modulus/2.

4 Claims, 7 Drawing Sheets

PLL LOOP ABLE TO RECOVER A SYNCHRONISATION CLOCK RHYTHM COMPRISING A TEMPORAL DISCONTINUITY

This application claims the benefit, under 35 U.S.C. §365 of International Application PCT/EP2008/061756, filed Sep. 5, 2008, which was published in accordance with PCT Article 21(2) on Mar. 12, 2009 in English and which claims the benefit of French patent application No. 0757419, filed Sep. 7, 2007.

The present invention relates to the domain of video equipment.

The present invention relates more particularly to a phase-locked loop of a receiver device for the transmission of a synchronisation signal comprising a temporal discontinuity, for example of the "Genlock" type (synchronisation locking), on a packet switching network, of for example IP (Internet Protocol) type, whether the network be wired (for example Ethernet (IEEE802.3)) or wireless (for example IEEE 802.16 D-2004).

PRIOR ART

Progress in the ability of IP networks to transport all types of signal (data or video) has made it possible to use these networks as the "backbone" architecture for video studios. Of capital importance to this evolution is therefore having a single infrastructure for the transport of data. Whereas in the past, several media were necessary to transport different signal types, the multiplexing properties offered by the IP layer enable a reduction in the number of media necessary: an IP network that links the different equipment.

In the prior art, the synchronisation of items of video equipment (cameras, etc.) in a studio is carried out by the transmission of a synchronisation signal commonly called "Genlock" or "Black burst". For example, the Genlock signal comprises two synchronisation signals, one is repeated every 40 ms and indicates the start of the video frame, the other is repeated every 64 µs (for a standard format and less for an HD format) and indicates the start of lines in the video frame. The waveform of the synchronisation signals depends on the format of the image transmitted over the network. For example, for a high definition image, the signal synchronisation has a tri-level form (−300 mV, 0V, +300 mV).

A known disadvantage presented by an IP/Ethernet network is that it introduces a strong jitter in a transmission of signals, and particularly for the transmission of a synchronisation signal. When such a signal is routed by an IP/Ethernet connection to different items of equipment for synchronising, this jitter results in fluctuations in the length of time required for the information carried by the synchronisation signal to reach the equipment.

In the prior art, devices are known for reconstructing, for each camera, a timing clock specific to this camera enabling the jitter to be overcome. The underlying principle of these devices is a high attenuation of the synchronisation signal jitter amplitude at the level of reception. In such a way, it can be guaranteed that an image generated by a camera is rigorously in phase with all of the images generated by neighbouring cameras connected to the same network.

Examples of such devices are described in the international PCT application FR2007/050918, they act on program clock reference (PCR) signals that represent very accurate reference clock signals. These digital signals are sent to cameras across a network so that they can locally reconstruct clock signals that are in phase with the reference clock.

According to the prior art, the reception device comprises:
means for receiving packets containing samples of the network coming from data sampled every $T_{ech}$ period,
means for regenerating a first counter CSR_PCR$_1$ using a phase-locked loop PLL$_1$,
means for initialising a second CPT counter every zero-crossing of said first counter CSR_PCR1,
means for generating image cues at every zero-crossing of the said second CPT counter, and
means for reconstituting a synchronisation signal from said image cues.

The phase-locked loop PLL$_1$ of the reception device acts as a low-pass filter that partially attenuates the jitter present in the samples received PCR$_r$ that have circulated on the network.

It is known that it is possible to create a digital phase-locked loop using an RST architecture. In this type of architecture, the phase-locked loop comprises three corrector blocks, known as R, S and T, positioned at two inputs and one output of a signal comparator. It is also known that these three corrector blocks combined with a synthesised signal generator allows the easy creation of a phase-locked loop that acts as a second-order low-pass filter in certain conditions. For example, these conditions are fulfilled when the z-transfer functions of two of the corrector blocks R and T, those placed at the signal comparator inputs, are $y_0 + y_1 Z^{-1}$ type, with $y_0$ and $y_1$ that are real numbers and when the z-transfer function of the corrector block S is in the form of $Z^{-1}/(1-Z^{-1})$. An example of one such phase-locked loop of the prior art will be described more specifically in what follows, particularly with the help of FIGS. 4 and 5.

However, it can be established that while a phase-locked loop with this particular architecture functions perfectly when an infinite ramp input is applied to it, this is not the case when the input signal has temporal discontinuities. Indeed, in the latter case, when coefficients $y_0$ and $y_1$ of the two corrector blocks R and T are identical, these corrector blocks R and T deliver to each of the signal comparator inputs signals that contain the same type of discontinuity. At the output of the comparator, these discontinuities cancel each other out if they occur at exactly the same moment, in other words no discontinuity occurs at the output of the comparator when the output signals from corrector blocks R and T are perfectly in phase.

Conversely, when the output signals of blocks R and T are not exactly in phase, a double discontinuity in the output signal from the comparator is observed that is detrimental to the functioning of the phase-locked loop PLL$_1$. During a first operating phase of the loop PLL$_1$ known as the "acquisition phase", the synchronisation signal and the synthesised signal are not exactly in phase, but the double discontinuity of the output signal is acceptable. However, in a second operating phase that corresponds to a steady state, the loop PLL$_1$ oscillates around a set point: it is not possible to guarantee that the discontinuities of the output signals of the blocks R and T are in phase: yet, during this second operating phase, the double discontinuity is not acceptable.

In a real system, a counting ramp cannot have an unlimited range value. This range value is generally limited by a capacity (PCR_Modulus) of a counter. The counting ramp moves from 0 to PCR_Modulus-1 then returns to 0. Specifically, a PLL loop whose architecture is of the RST type is not suitable for a sawtooth input signal.

A solution to this problem consists of offering a PLL loop architecture compatible with a synchronisation signal comprising a temporal discontinuity, and specifically compatible with a synchronisation signal whose time waveform is of the sawtooth type.

SUMMARY OF THE INVENTION

For this purpose, the present invention relates to a phase-locked loop $PLL_1$ that can recover the timing of a synchronisation signal comprising a temporal discontinuity which has a maximum amplitude equal to PCR_Modulus. The phase-locked loop $PLL_1$ comprises:

a sample comparator $CMP_1$ comparing the samples $PCR_r$ of a synchronisation signal and local samples $PCR\_loc_1$ of a synthesised signal $CSR\_PCR_1$;

means $GEN_1$ for producing the synthesised signal CSR_PCR) from a corrected signal ERC;

a corrector $COR_1$ receiving a comparison result (ERR) delivered by the comparison means $CMP_1$ and delivering the corrected signal ERC.

According to the invention, the comparison means $CMP_1$ comprises the means to determine a difference in value between the local samples $PCR\_loc_1$ and the samples of the synchronisation signal and in that the comparison result ERR has a value that depends on the value $\epsilon$ and on the difference between the value $\epsilon$ and the value PCR_Modulus/2.

According to a particular embodiment, the corrector ($COR_1$) comprises a single corrector block R having a z-transfer function $F_R$ that is expressed in the form $y_0+y_1Z^{-1}$, where $y_0$ and $y_1$ are real numbers.

According to a particular embodiment, the corrector COR1 further comprises a single corrector block S having a z-transfer function $F_S$ that is expressed in the form $Z^{-1}/(1-Z^{-1})$.

According to a particular embodiment, the corrector block R is placed in series with corrector block S.

According to a particular embodiment, the synchronisation signal has a sawtooth time waveform.

A first advantage of the invention lies in its capacity it offers to function with a synchronisation signal comprising a temporal discontinuity.

A second advantage of the invention lies in the simplification of the PLL loop architecture in comparison with standard RST architecture as a PLL loop according to the invention comprises only two corrector blocks, namely one less than an RST type PLL loop. It is known that a phase-locked loop $PLL_1$ can be designed from VHDL code (Very High Speed Integrated Circuit Hardware Description Language) in a programmable component, this simplification is advantageous as it allows a reduction in the number of operations and correlatively a reduction in the number of logic flip-flops used to create the loop $PLL_1$. This frees up space for creating other functions in the same programmable component.

BRIEF DESCRIPTION OF THE DRAWINGS

The invention will be better understood from the following description of an embodiment of the invention provided as an example by referring to the annexed figures, wherein.

DETAILED DESCRIPTION OF THE EMBODIMENTS OF THE INVENTION

Figure 1:
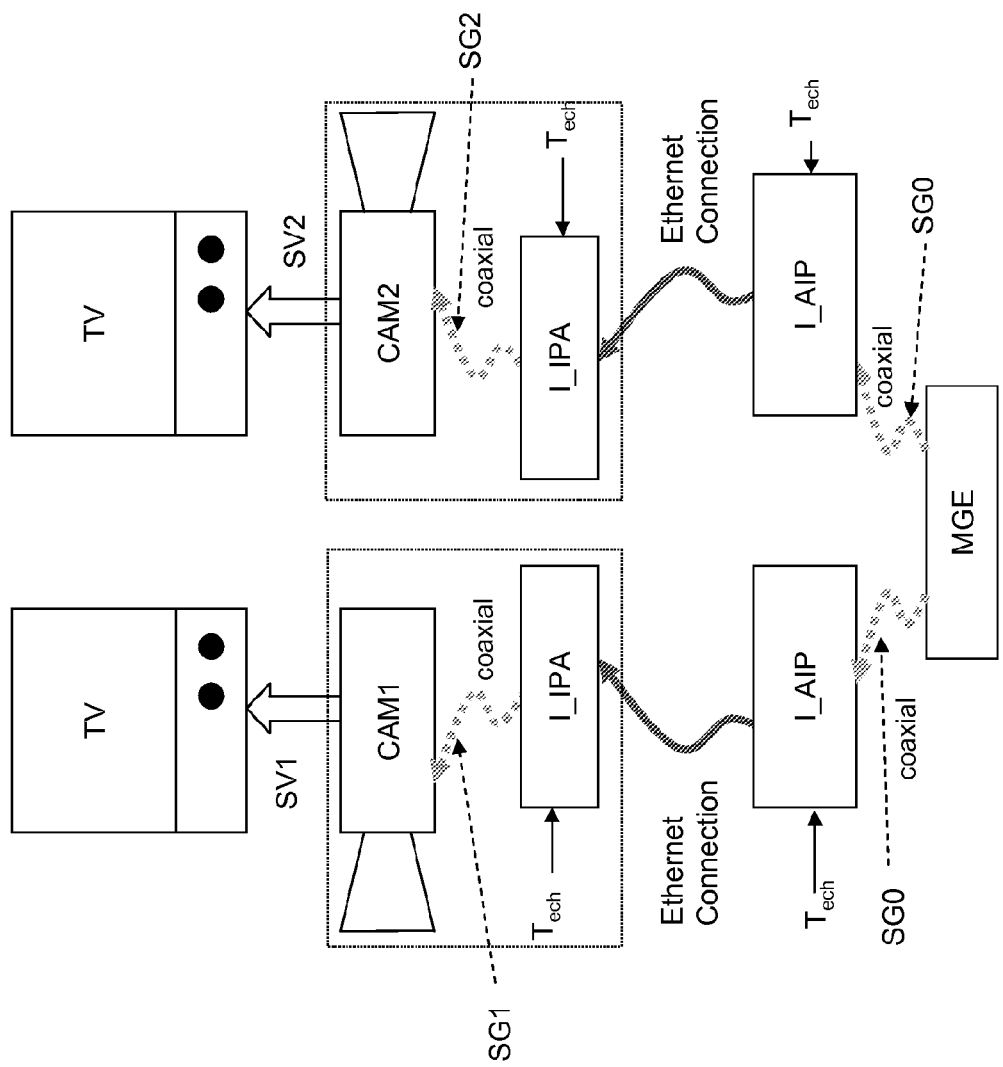
FIG. 1 shows the transmission of genlock information between two cameras linked via an IP/Ethernet network.

The current analogue domain is interfaced with the IP/Ethernet network on the transmission side, and the IP/Ethernet network is interfaced with the analogue domain on the reception side, as illustrated in FIG. 1.

In the same figure, the transmission side comprises a "Genlock master" MGE that is connected to an IP/Analogue interface I_AIP. The Genlock master MGE sends a Genlock signal SG0 to the interfaces I_AIP.

The reception side is constituted by two cameras (CAM1, CAM2) each connected to an IP/Analogue interface I_IPA. The interfaces I_IPA that will eventually be included in the cameras themselves are responsible for reconstructing the Genlock signals SG1, SG2 intended for cameras CAM1, CAM2. The cameras CAM1, CAM2 each produce a video signal SV1, SV2 that is required to be synchronised perfectly.

The transmission and reception sides are linked together by a packet switching network that is the source of a jitter occurring in the Genlock signal SG0.

A sampling pulse, in the $T_{ech}$, period, is generated from a first synchronisation layer, for example IEEE1588, and is sent to the transmission and reception sides. Indeed, the PTP protocol (Precision Time Protocol) based on IEEE1588 enables synchronisation to be obtained between the equipment connected on the Ethernet network to an order of microseconds. In other words, all the time bases of every item of equipment progress at the same time with a precision close to the order of microseconds. Each of these time bases can be used in this case to generate its own sampling pulse in the $T_{ech}$, period. Use of the IEEE1588 layer is not a required route. Any system capable of providing sampling pulses to the various items of equipment on the network in the $T_{ech}$ period could be suitable. For example, a 5 ms sampling pulse from a wireless transmission physical layer can be used.

Figure 2:
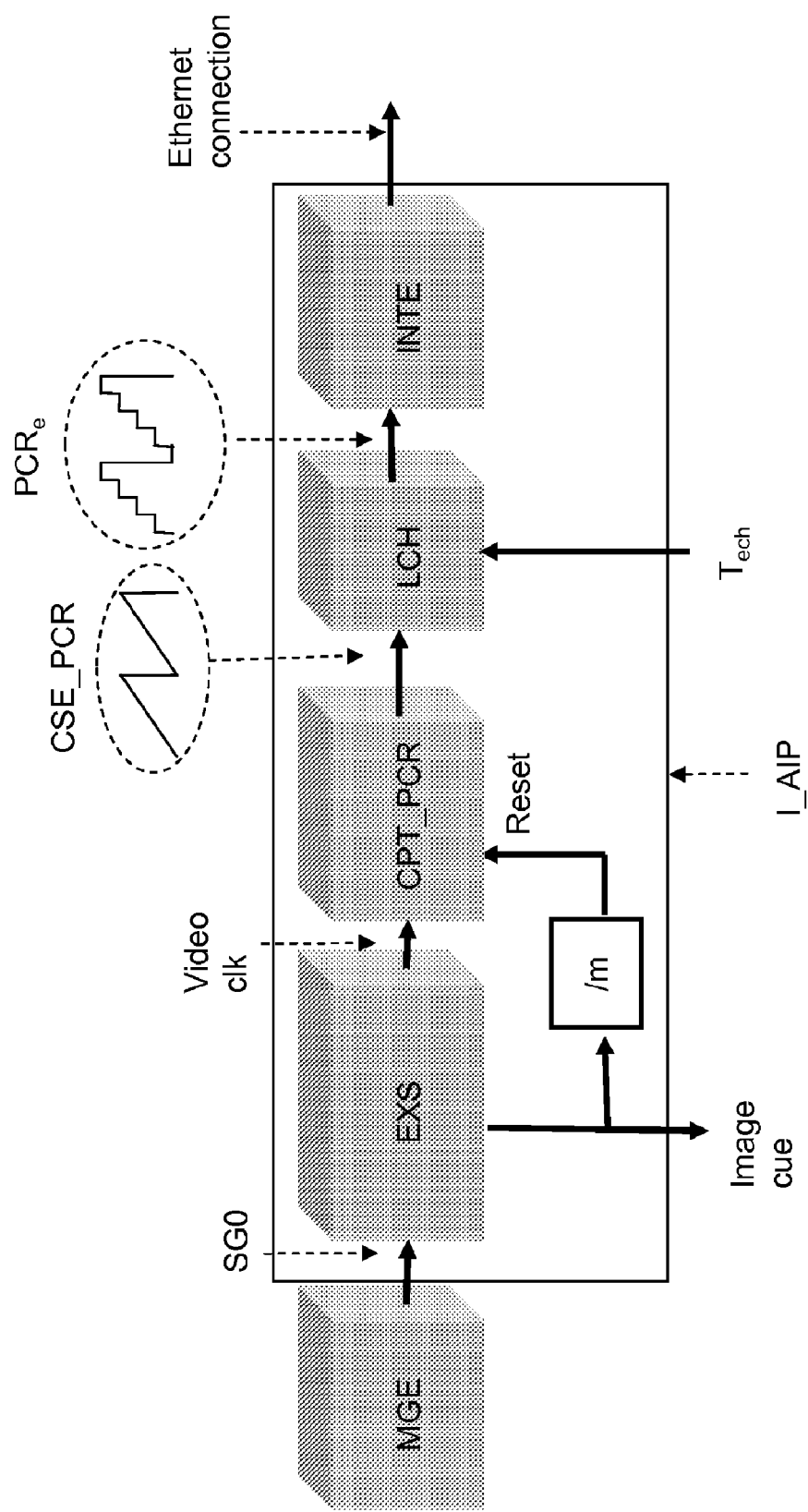
FIG. 2 shows the interfacing between the analogue domain and the IP/Ethernet network.

FIG. 2 details the processing of the Genlock signal SG0 from MGE within the interface I_AIP.

First, a module EXS extracts the synchronisation information from the signal SG0 in order to recover a video timing clock (noted as Clk on FIG. 2). More specifically, the module EXS is responsible for the generation of an image cue at the beginning of each image. Furthermore, the module EXS comprises an image counter, for example a 40 ms counter, which is not shown on FIG. 2. The output of this image counter progresses according to the counting ramp, crossing 0 at each image period, that is every 40 ms in the case of the image counter cited in the aforementioned example.

The image counter delivers a stair-step signal. The steps have a unitary height. The signal range value, that is to say the height corresponding to the difference in level between the highest step and the lowest step is equal to $40 \text{ ms}.F_{out}$, where $F_{out}$ is the frequency of the video clock Clk. The counter CPT successively delivers all of the integer values from 0 to $40 \text{ ms}.F_{out}-1$.

The timing video clock is used to determine the rhythm of a counter CPT_PCR. The output of the counter CPT_PCR is a counting ramp, whose period is m image periods. Every "m" image, the counter CPT_PCR is reset, that is to say that the counting ramp CSE_PCR is reset to 0.

Next, a module LCH samples the counting ramp CSE_PCR every $T_{ech}$ period to produce samples $PCR_e$. These samples $PCR_e$ are sent across the network and travel to the reception side through a network interface (block INTE).

Figure 3:
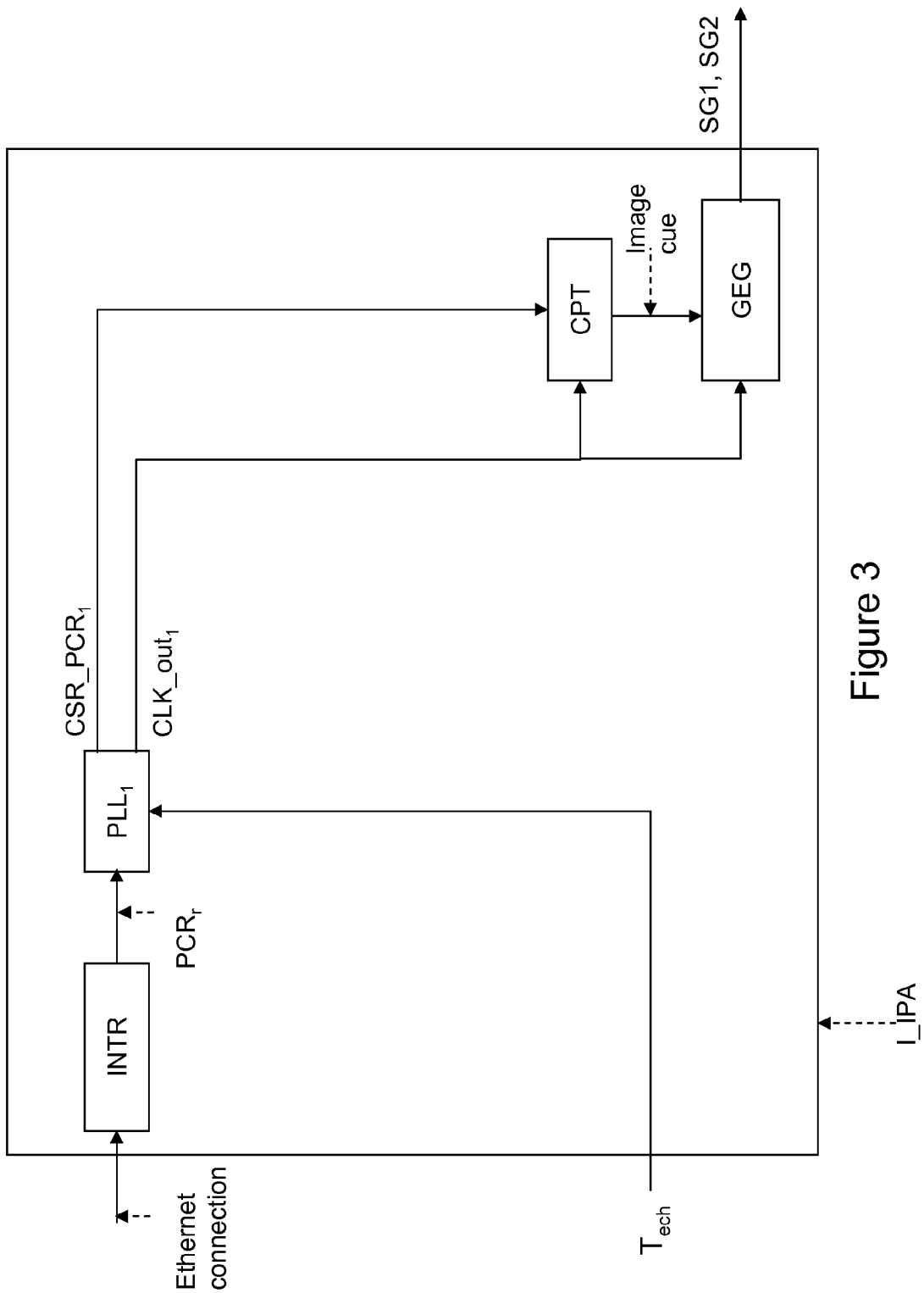
FIG. 3 shows the regeneration of the Genlock signal on the reception side according to the prior art, FIG. 4 diagrammatically shows a phase-locked loop architecture according to the prior art, FIG. 5a diagrammatically shows an architecture of an R corrector block according to the prior art.

FIG. 3 shows the reception side according to the prior art. The interface I_IPA recovers the PCR samples that have been sent on the network. These samples $PCR_e$ are received by a network interface (module INTR) with a delay linked to the transport between the transmission device and the reception device: the module INTR produces samples $PCR_r$. The samples $PCR_e$, which are produced at regular $T_{ech}$ intervals on the transmission side, arrive at irregular intervals on the reception side: this is largely due to the jitter introduced during transport on the network. The samples $PCR_r$ are taken into account at regular $T_{ech}$ intervals and hence, the majority of the jitter introduced during packet transport is eliminated.

The imprecision between the transmission and reception sampling times is absorbed by a phase-locked loop $PLL_1$ whose bandwidth is appropriated. The characteristics of the phase-locked loop $PLL_1$ guarantee a reconstituted clock generation $CLK\_out_1$ with a reduced jitter.

The phase-locked loop $PLL_1$ acts as a system receiving $PCR_r$ samples and delivering:
- a reconstituted clock $CLK\_out_1$,
- a counting ramp $CSR\_PCR_1$ and,
- local samples $PCR\_loc_1$.

When the loop $PLL_1$ operates in a steady state, the samples $PCR_r$ are noticeably equal to the samples $PCR\_loc_1$.

The reconstituted clock $CLK\_out_1$ determines the rhythm of a CPT image counter similar to the image counter on the transmission side, for example a 40 ms counter. The image counter CPT is reset each time the counting ramp $CSR\_PCR_1$ crosses 0. Between two successive initialisations, the image counter CPT progresses freely and produces an image cue that supplies a local Genlock generator, GEG to produce a reconstructed Genlock signal SG1, SG2 designed to synchronise the cameras CAM1, CAM2.

The reconstructed Genlock signal SG1, SG2 that is generated from the counting ramp $CSR\_PCR_1$ and the reconstituted clock $CLK\_out_1$ is in phase with the Genlock signal SG0 on the transmission side, to the nearest clock pulse.

Figure 4:
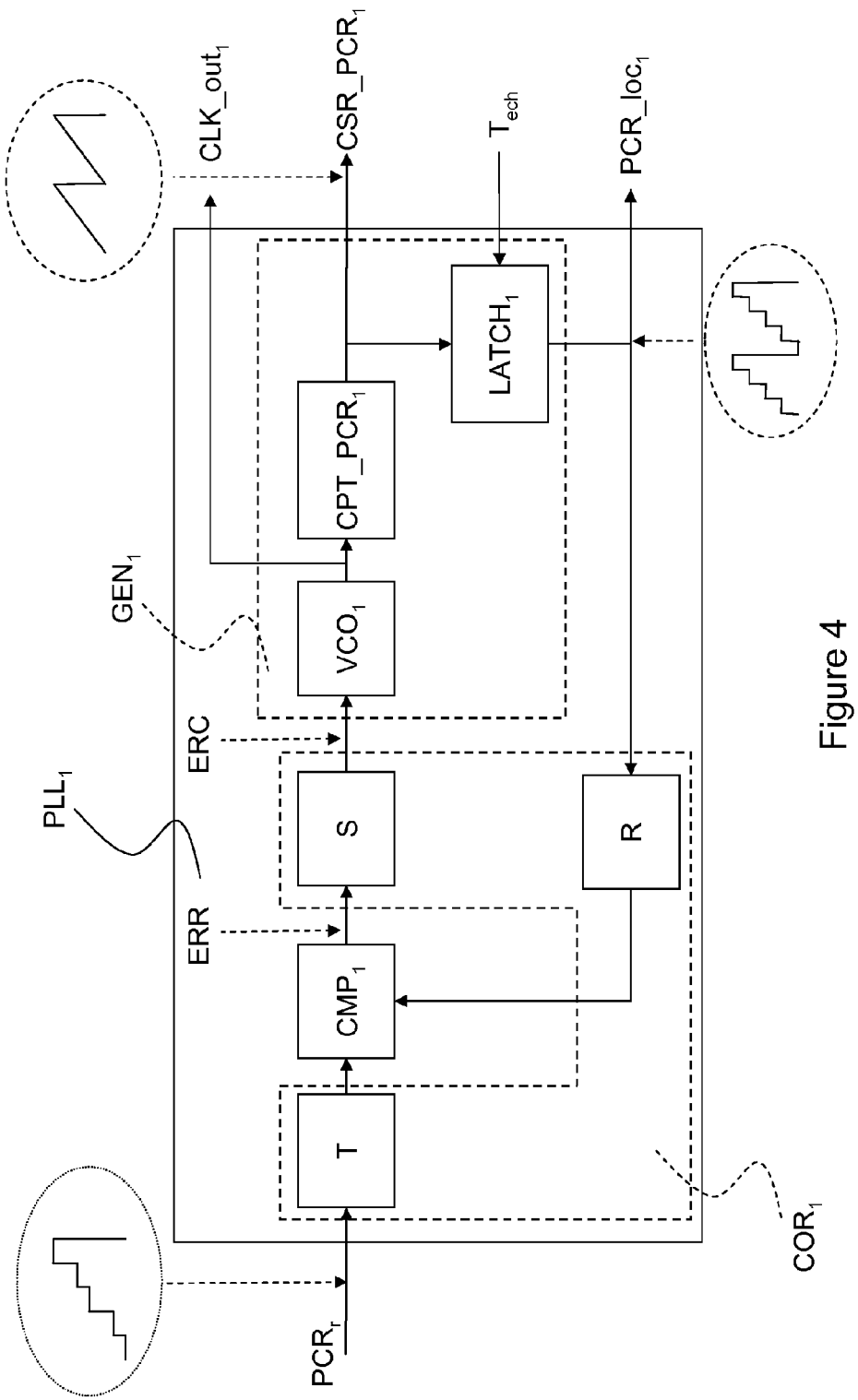

FIG. 4 diagrammatically shows a $PLL_1$ phase-locked loop architecture used in an I_IPA interface according to the prior art.

As shown in FIG. 4, the phase-locked loop $PLL_1$ whose architecture is known as RST comprises:
- a sample comparator $CMP_1$ that compares the samples $PCR_r$, corrected by a corrector block T and local samples corrected by a corrector block R, the comparator delivering a sample comparison result, or an error signal ERR, the error signal is corrected by a corrector block S,
- a corrector $COR_1$ comprising three corrector blocks R, S, T, the corrector $COR_1$ delivering a corrected error signal ERC,
- a configurable oscillator $VCO_1$ receiving the corrected error signal ERC and delivering a reconstituted clock $CLK\_out_1$, the clock $CLK\_out_1$ has a frequency that depends on the signal ERC and that is proportional to a fixed gain G,
- a counter CPT_PCR1 that produces a counting ramp $CSR\_PCR1$ according to a rate that is printed by the reconstituted clock $CLK\_out_1$,
- a support system with the value $LATCH_1$ that generates local samples $PCR\_loc_1$ from the values of the counting ramp $CSR\_PCR_1$ at the times $T_{ech}$, Hereafter, it is agreed to group together the digital oscillator $VCO_1$, the counter $CPT\_PCR_1$ and the support system with the value $LATCH_1$ in the means $GEN_1$ to produce a synthesised signal $PCR\_loc_1$ from a corrected signal ERC.

Figures 5A, 5B:
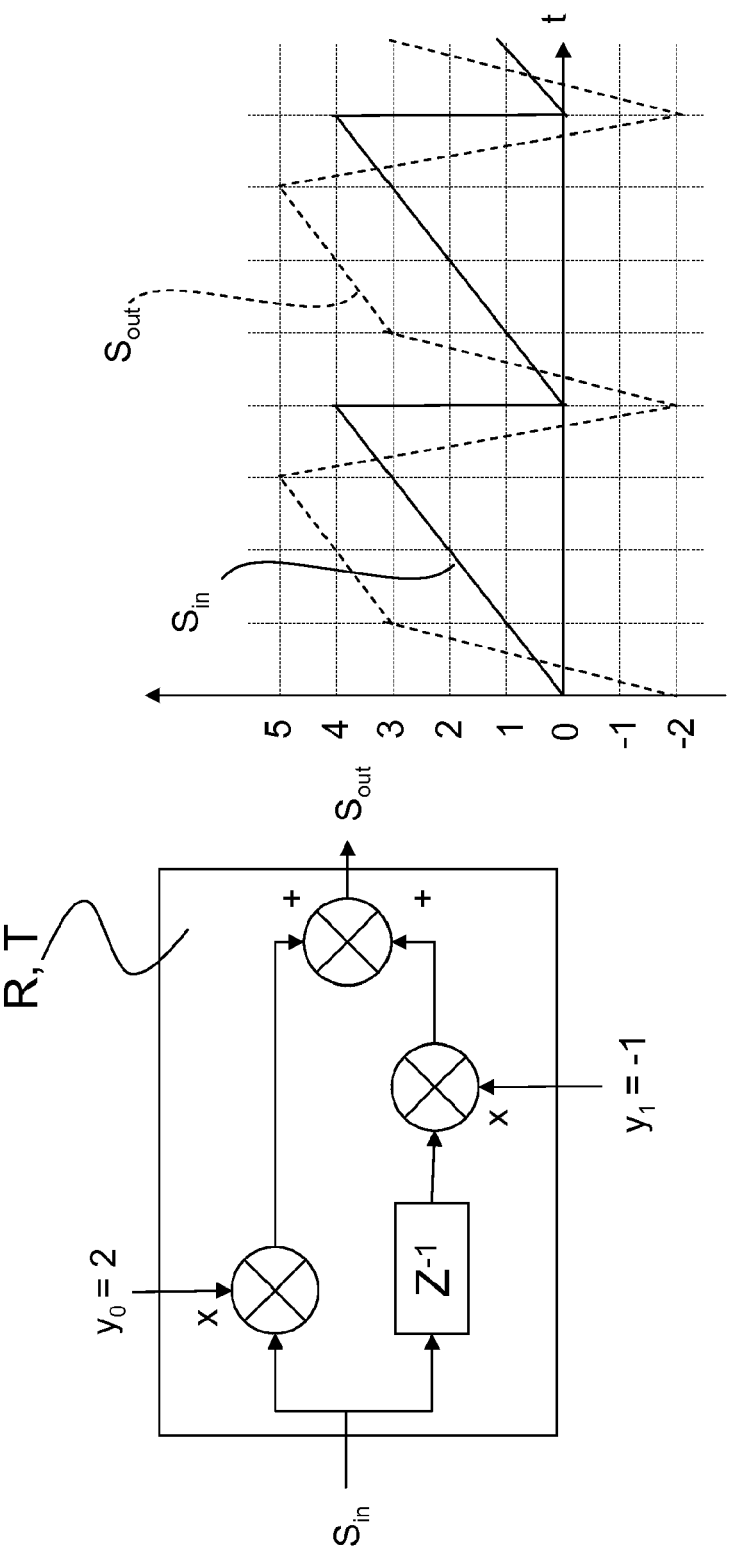
FIG. 5b shows the time waveforms of an input signal $S_{in}$ of a corrector block comprising a temporal discontinuity and an output signal of the same corrector block for the given values of $y_0$ and $y_1$ according to the prior art.

FIG. 5a diagrammatically shows an architecture of a corrector block R, T.

FIG. 5b shows the time waveforms of a signal $S_{out}$ sampled at four points. $S_{in}$ is an input signal from the corrector block R, T shown in FIG. 5a, it comprises a temporal discontinuity. $S_{out}$ is the corresponding output signal of the corrector block.

Values are chosen, for example $y_0=2$ and $y_1=-1$. A discontinuity occurs on $S_{out}$ (jump between an $S_{out}$ value equal to +5 and an $S_{out}$ value equal to −2). When two signals with a waveform similar to $S_{out}$ are compared, for example $S_{out\_A}$ and $S_{out\_B}$, the discontinuities of each of these signals appear in a comparison signal if the two discontinuities do not appear at the same time.

Figure 6:
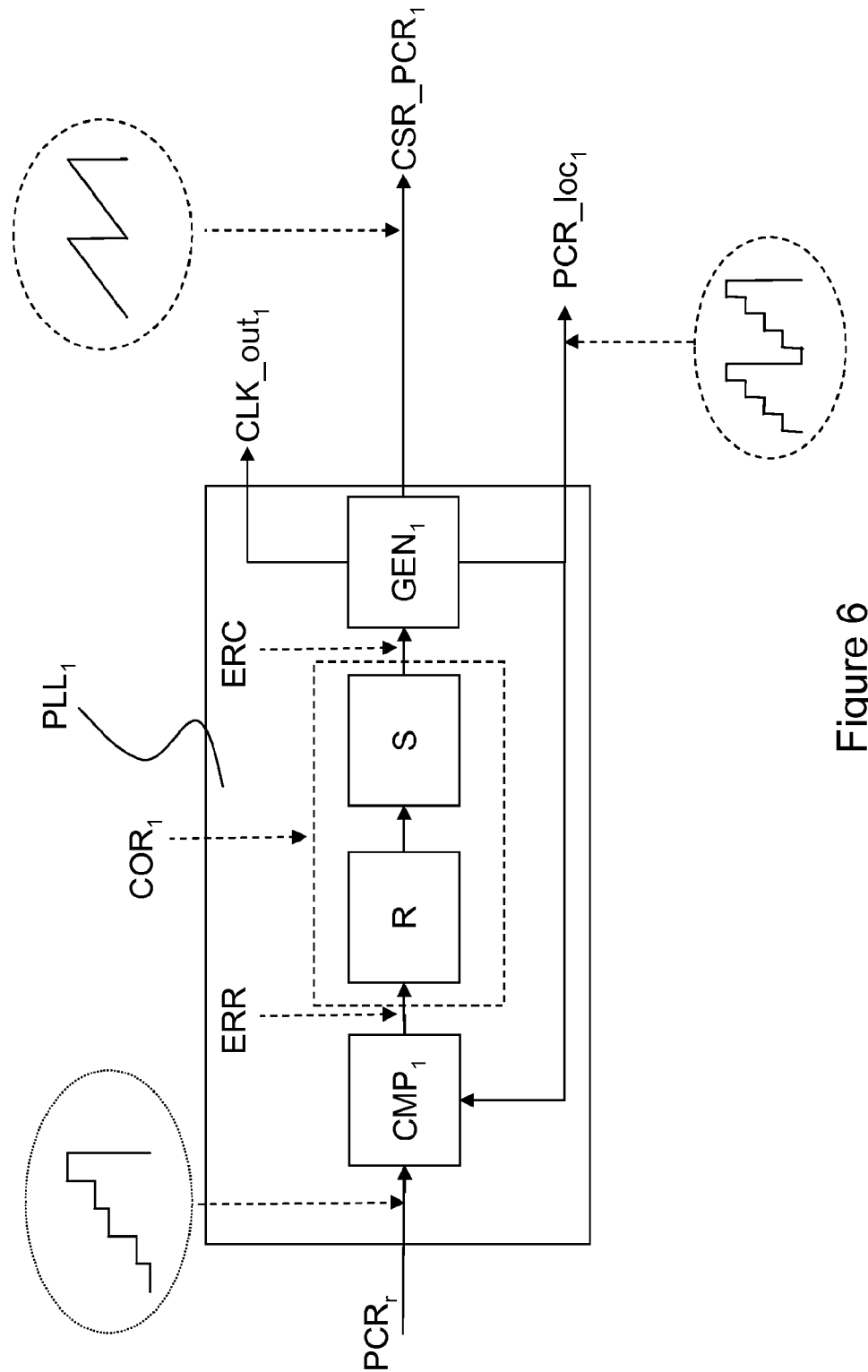
FIG. 6 diagrammatically shows a phase-locked loop architecture according to the invention.

FIG. 6 diagrammatically shows a $PLL_1$ phase-locked loop architecture according to the invention. The loop $PLL_1$ receives samples $PCR_R$ from a synchronisation signal comprising a temporal discontinuity of maximum amplitude noted PCR_Modulus.

For example, the samples $PCR_R$ from the synchronisation signal $PCR_R$ have a sawtooth time waveform with a maximum amplitude PCR_Modulus. "Amplitude" is understood to mean the maximum difference between the samples $PCR_R$ of the synchronisation signal.

The sample comparator $CMP_1$ comprises the means for determining a difference value $\epsilon$ between the local samples $PCR\_loc_1$ and the received samples $PCR_r$. A comparison result ERR delivered by the sample comparator $CMP_1$ has a value that depends on the difference value $\epsilon$ and on the difference between the value $\epsilon$ and the value PCR_Modulus/2.

Figure 7:
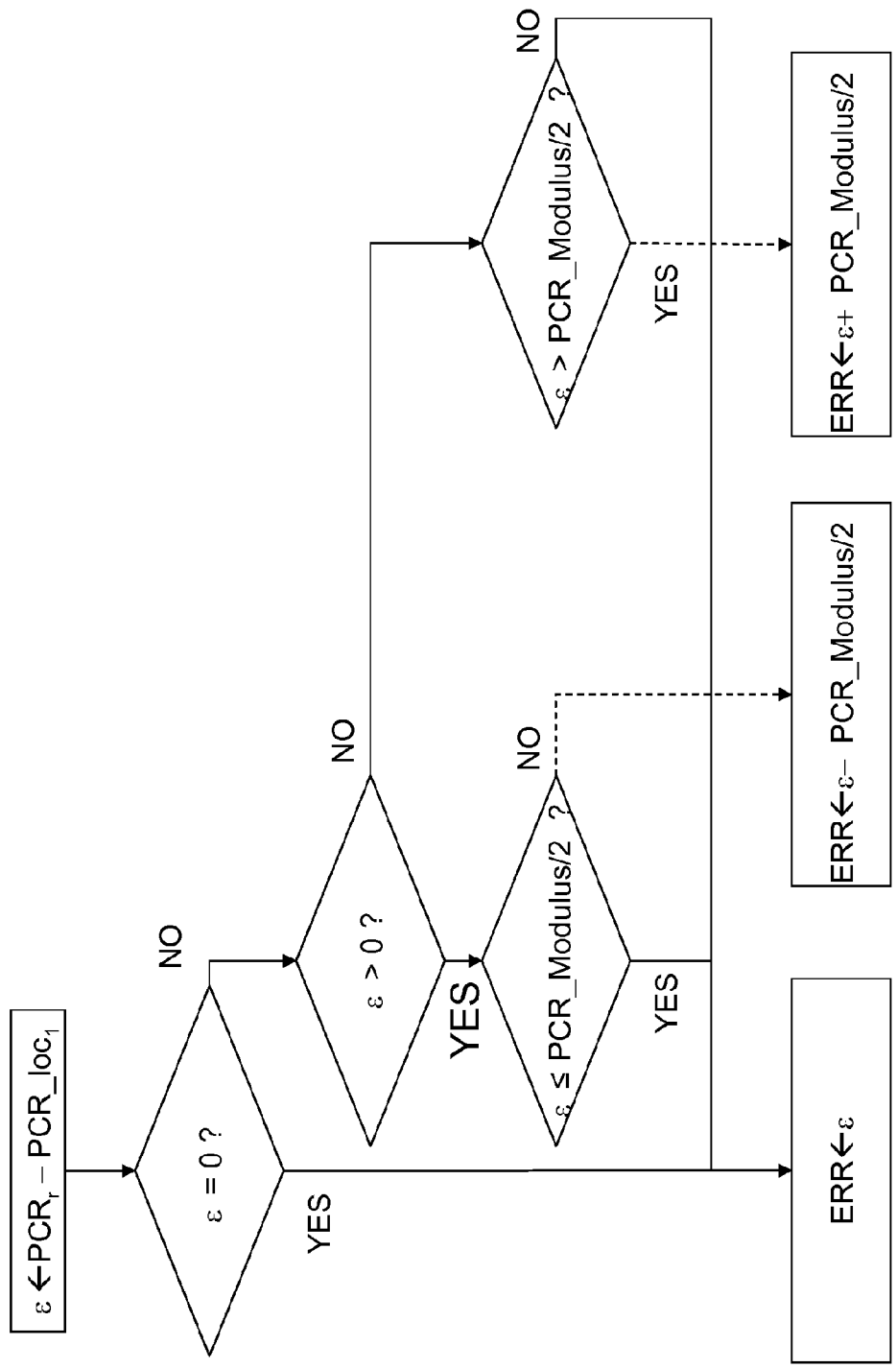
FIG. 7 shows an example of a flowchart for the sample comparator of a phase-locked loop according to the invention.

An example of an operation flowchart for the sample comparator $CMP_1$ is shown in FIG. 7. It constitutes an illustration of the dependence of the comparison result ERR in relation to the difference $\epsilon$ and the difference between $\epsilon$ and PCR_Modulus/2.

The corrector $COR_1$ comprises a single corrector block R having a z-transfer function $F_R$ such that $F_R(Z)=y_0+y_1Z^{-1}$, where $y_0$ and $y_1$ are real numbers. The function of the corrector block R can be considered to be "factorised".

The corrector $COR_1$ further comprises a single corrector block S having a z-transfer function $F_S$ such that $F_S(Z)=Z^{-1}/(1-Z^1)$.

Advantageously, the corrector block R is placed in series with the corrector block S.

The invention is described in the preceding text as an example. It is understood that those skilled in the art are capable of producing variants of the invention without leaving the scope of the patent.

The invention claimed is:

1. Phase-locked loop for synthesizing a synchronization signal from samples $PCR_r$ resulting from sampling operations of a master synchronization signal, said sampling operations being cadenced by a sampling clock having a period, said master synchronization signal having a sawtooth time waveform comprising a succession of identical counting ramps separated by a temporal discontinuity with a maximum amplitude PCR_Modulus, said loop comprising:
- comparison means for comparing said samples $PCR_r$ and local samples $PCR\_loc_1$, said comparison means issuing a comparison result;
- means for producing the synthesized signal and said local samples $PCR\_loc_1$ from a corrected signal, wherein said local samples $PCR\_loc_1$ result from sampling operations of said synthesized signal cadenced by said sampling clock,
- a corrector receiving the comparison result delivered by the comparison means and delivering the corrected signal, the corrector comprising a single first corrector block having a z-transfer function that is expressed in the form $y_0+y_1 Z^{-1}$, where $y_0$ and $y_1$ are real numbers, wherein the comparison means comprises means for performing a difference $\epsilon=PCR_r-PCR\_loc_1$ and the comparison result has a value equal to said difference or to a linear combination of said difference and of the half value of said maximum amplitude PCR_Modulus.

2. Phase-locked loop according to claim 1, wherein the corrector further comprises a single second corrector block having a z-transfer function $F_S$ that is expressed in the form $Z^{-1}/(1-Z^{-1})$.

3. Phase-locked loop according to claim 2, wherein the first corrector block is placed in series with the second corrector block.

4. Phase-locked loop according to claim 1, wherein the synthesized synchronization signal has a sawtooth time waveform comprising a succession of identical counting ramps separated by a temporal discontinuity with a maximum amplitude PCR_Modulus and said master synchronization signal and synthesized signal are in phase when said loop operates in steady state.

* * * * *